United States Patent
Ka et al.

(10) Patent No.: US 11,587,510 B2
(45) Date of Patent: *Feb. 21, 2023

(54) DISPLAY DEVICE AND DRIVING METHOD THEREOF

(71) Applicant: SAMSUNG DISPLAY CO., LTD., Yongin-si (KR)

(72) Inventors: Ji Hyun Ka, Yongin-si (KR); Seung Ji Cha, Yongin-si (KR); Mi Hae Kim, Yongin-si (KR); Ki Myeong Eom, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/727,513

(22) Filed: Apr. 22, 2022

(65) Prior Publication Data

US 2022/0246099 A1  Aug. 4, 2022

Related U.S. Application Data

(63) Continuation of application No. 17/179,240, filed on Feb. 18, 2021, which is a continuation of application
(Continued)

(30) Foreign Application Priority Data

Nov. 1, 2017  (KR) .......................... 10-2017-0144924

(51) Int. Cl.
*G09G 3/20* (2006.01)
*G09G 3/3258* (2016.01)
(Continued)

(52) U.S. Cl.
CPC ......... *G09G 3/3258* (2013.01); *G09G 3/2092* (2013.01); *G09G 3/3225* (2013.01);
(Continued)

(58) Field of Classification Search
CPC .. G09G 3/3258; G09G 3/2092; G09G 3/3225; G09G 3/3233; G09G 3/3266;
(Continued)

(56) References Cited

U.S. PATENT DOCUMENTS 7,855,700 B2  12/2010  Kim et al.
8,018,405 B2  9/2011  Kwak et al.
(Continued)

FOREIGN PATENT DOCUMENTS

CN  1959790 A  5/2007
CN  104217675 A  12/2014
(Continued)

OTHER PUBLICATIONS

EPO Extended Search Report dated Oct. 19, 2018, for corresponding European Patent Application No. 18192805.2 (11 pages).
(Continued)

*Primary Examiner* — Thuy N Pardo
(74) *Attorney, Agent, or Firm* — Lewis Roca Rothgerber Christie LLP

(57) ABSTRACT

A display device includes: a first pixel including a first organic light emitting diode; an initialization voltage generator for generating a first initialization voltage to be supplied to an anode of the first organic light emitting diode; and a timing controller including a first lookup table in which a plurality of first initialization voltage values corresponding to a plurality of maximum luminances are recorded, the timing controller being configured to determine a value of the first initialization voltage, based on reception information on a target maximum luminance and the first lookup table.

30 Claims, 14 Drawing Sheets

Related U.S. Application Data

No. 16/007,755, filed on Jun. 13, 2018, now Pat. No. 10,957,255.

(51) Int. Cl.

| | |
|---|---|
| *H01L 51/52* | (2006.01) |
| *G09G 3/3233* | (2016.01) |
| *G09G 3/3291* | (2016.01) |
| *H01L 27/32* | (2006.01) |
| *G09G 3/3266* | (2016.01) |
| *G09G 3/3225* | (2016.01) |
| *G09G 3/3275* | (2016.01) |

(52) U.S. Cl.
CPC ......... *G09G 3/3233* (2013.01); *G09G 3/3266* (2013.01); *G09G 3/3275* (2013.01); *G09G 3/3291* (2013.01); *H01L 27/3276* (2013.01); *H01L 51/5206* (2013.01); *H01L 51/5221* (2013.01); *G09G 2300/0426* (2013.01); *G09G 2300/0452* (2013.01); *G09G 2300/0465* (2013.01); *G09G 2300/0814* (2013.01); *G09G 2300/0861* (2013.01); *G09G 2300/0866* (2013.01); *G09G 2310/0216* (2013.01); *G09G 2310/08* (2013.01); *G09G 2320/0233* (2013.01); *G09G 2320/0238* (2013.01); *G09G 2320/0242* (2013.01); *G09G 2320/0285* (2013.01); *G09G 2330/021* (2013.01); *G09G 2360/144* (2013.01)

(58) Field of Classification Search
CPC ............... G09G 3/3275; G09G 3/3291; G09G 2300/0426; G09G 2300/0452; G09G 2300/0465; G09G 2300/0814; G09G 2300/0861; G09G 2300/0866; G09G 2310/0216; G09G 2310/08; G09G 2320/0233; G09G 2320/0238; G09G 2320/0242; G09G 2320/0285; G09G 2330/021; G09G 2360/144; H01L 27/3276; H01L 51/5206; H01L 51/5221
USPC ................................ 345/55, 82, 89, 204, 211
See application file for complete search history.

(56) References Cited

U.S. PATENT DOCUMENTS

| | | | |
|---|---|---|---|
| 9,208,727 B2 | 12/2015 | Lee et al. | |
| 9,608,050 B2 | 3/2017 | Jin | |
| 9,990,881 B2 | 6/2018 | Kimura et al. | |
| 10,769,999 B2 | 9/2020 | Park et al. | |
| 10,957,255 B2 | 3/2021 | Ka et al. | |
| 11,233,096 B2 | 1/2022 | Huangfu et al. | |
| 2004/0108818 A1 | 6/2004 | Cok et al. | |
| 2004/0119669 A1 | 6/2004 | Ishizuka et al. | |
| 2004/0178974 A1 | 9/2004 | Miller et al. | |
| 2005/0122296 A1* | 6/2005 | Kubo | G09G 3/3648 |
| | | | 345/89 |
| 2007/0103405 A1 | 5/2007 | Kwak et al. | |
| 2007/0152920 A1 | 7/2007 | Yamashita et al. | |
| 2008/0042943 A1 | 2/2008 | Cok | |
| 2008/0074363 A1 | 3/2008 | Yamashita et al. | |
| 2008/0246785 A1 | 10/2008 | Shirasaki et al. | |
| 2008/0308819 A1 | 12/2008 | Louwsma et al. | |
| 2009/0207160 A1 | 8/2009 | Shirasaki et al. | |
| 2010/0103206 A1* | 4/2010 | Kamada | G09G 3/3648 |
| | | | 345/89 |
| 2011/0037791 A1 | 2/2011 | Haas et al. | |
| 2011/0080442 A1 | 4/2011 | Ghosh et al. | |
| 2011/0084955 A1 | 4/2011 | Kim | |
| 2011/0199395 A1 | 8/2011 | Nathan et al. | |
| 2011/0291083 A1 | 12/2011 | Kim et al. | |
| 2012/0286653 A1 | 11/2012 | Abe et al. | |
| 2013/0037827 A1 | 2/2013 | Levermore et al. | |
| 2013/0135272 A1* | 5/2013 | Park | G09G 3/006 |
| | | | 345/211 |
| 2014/0028649 A1 | 1/2014 | Kim et al. | |
| 2014/0028859 A1 | 1/2014 | Kim et al. | |
| 2014/0118409 A1 | 5/2014 | Jun et al. | |
| 2014/0132590 A1 | 5/2014 | Inoue et al. | |
| 2014/0240521 A1 | 8/2014 | Kwak | |
| 2014/0253421 A1 | 9/2014 | Izumi et al. | |
| 2014/0306946 A1 | 10/2014 | Senda | |
| 2014/0333682 A1 | 11/2014 | Okuno et al. | |
| 2014/0375700 A1 | 12/2014 | Takahama et al. | |
| 2015/0002378 A1 | 1/2015 | Nathan et al. | |
| 2015/0009194 A1 | 1/2015 | Kim et al. | |
| 2015/0097872 A1 | 4/2015 | Jeong et al. | |
| 2015/0161941 A1 | 6/2015 | Lim et al. | |
| 2015/0279278 A1 | 10/2015 | Park et al. | |
| 2015/0371606 A1* | 12/2015 | Lee | G09G 3/3233 |
| | | | 345/82 |
| 2016/0125798 A1* | 5/2016 | Park | G09G 3/3233 |
| | | | 345/204 |
| 2016/0125809 A1 | 5/2016 | Hwang | |
| 2016/0155387 A1 | 6/2016 | Kim et al. | |
| 2016/0189609 A1 | 6/2016 | Seo et al. | |
| 2016/0240132 A1 | 8/2016 | Takahiro | |
| 2016/0240138 A1 | 8/2016 | Xu | |
| 2016/0293103 A1 | 10/2016 | Kimura et al. | |
| 2016/0305394 A1 | 10/2016 | Demmons | |
| 2016/0358547 A1 | 12/2016 | Zhu et al. | |
| 2017/0116922 A1 | 4/2017 | Jung et al. | |
| 2017/0124941 A1 | 5/2017 | Na et al. | |
| 2017/0148865 A1 | 5/2017 | Cho et al. | |
| 2017/0150147 A1 | 5/2017 | Forsyth et al. | |
| 2017/0169764 A1 | 6/2017 | Lee et al. | |
| 2017/0186375 A1 | 6/2017 | Jung et al. | |
| 2017/0249903 A1 | 8/2017 | Xiang et al. | |
| 2017/0365218 A1 | 12/2017 | Jeong et al. | |
| 2018/0174931 A1 | 6/2018 | Henley | |
| 2019/0252644 A1 | 8/2019 | Kajimoto | |
| 2020/0227502 A1* | 7/2020 | Song | G09G 3/3233 |
| 2020/0365086 A1 | 11/2020 | Park et al. | |

FOREIGN PATENT DOCUMENTS

| | | |
|---|---|---|
| CN | 109671395 A | 4/2019 |
| CN | 112037715 B | 10/2021 |
| KR | 10-0840116 B1 | 6/2008 |
| KR | 10-1101070 B1 | 12/2011 |
| KR | 10-2014-0134046 A | 11/2014 |
| KR | 10-2015-0006144 A | 1/2015 |
| KR | 10-2015-0064543 A | 6/2015 |
| KR | 10-2017-0066771 A | 6/2017 |
| KR | 10-2017-0078916 A | 7/2017 |
| KR | 10-2017-0143049 A | 12/2017 |
| WO | WO 2012/157575 A1 | 11/2012 |

OTHER PUBLICATIONS

Office Action for U.S. Appl. No. 16/007,755 dated Apr. 16, 2020, 9 pages.
Office Action for U.S. Appl. No. 17/179,240 dated Mar. 16, 2022, 12 pages.
Office Action for U.S. Appl. No. 17/692,562 dated Jun. 13, 2022, 55 pages.
U.S. Final Rejection dated Apr. 20, 2022, issued in cross-reference U.S. Appl. No. 16/944,477 (49 pages).
Office action issued in U.S. Appl. No. 16/007,755, dated Oct. 31, 2019, 10 pages.
Notice of Allowance issued in U.S. Appl. No. 16/007,755, dated Nov. 17, 2020, 8 pages.
U.S. Notice of Allowance dated Sep. 2, 2022, issued in U.S. Appl. No. 17/179,240 (9 pages).

* cited by examiner

TABLE 1

DISPLAY DEVICE AND DRIVING METHOD THEREOF

CROSS-REFERENCE TO RELATED APPLICATIONS

This application is a continuation of U.S. patent application Ser. No. 17/179,240, filed Feb. 18, 2021, which is a continuation of U.S. patent application Ser. No. 16/007,755, filed Jun. 13, 2018, now U.S. Pat. No. 10,957,255, which claims priority to and the benefit of Korean Patent Application No. 10-2017-0144924, filed Nov. 1, 2017, the entire content of all of which is incorporated herein by reference.

BACKGROUND

1. Field

Aspects of some example embodiments of the present disclosure relates to a display device and a driving method thereof.

2. Related Art

With the development of information technologies, the importance of a display device that is a connection medium between a user and information has increased. Accordingly, display devices such as liquid crystal display devices, organic light emitting display devices, and plasma display panels are increasingly used.

Among these display devices, organic light emitting display devices display images using an organic light emitting diode that generates light by recombination of electrons and holes. Organic light emitting display devices have a relatively high response speed and are driven with relatively low power consumption.

Organic light emitting display devices display a target image to a user by writing a data voltage for expressing a target gray scale in each pixel and allowing a plurality of organic light emitting diodes to emit light, corresponding to the data voltage.

In general, the plurality of organic light emitting diodes are configured with red, blue, and green organic light emitting diodes. The plurality of organic light emitting diodes emit lights having different wavelengths as organic materials of the organic light emitting diodes have different band gaps.

Amounts of driving current supplied to organic light emitting diodes of colors may be differently set according to emission efficiencies of such organic materials. For example, a relatively small driving current may be supplied to an organic light emitting diode of a color having an organic material of which emission efficiency is high.

However, it may take a relatively long period of time to charge a capacitor of the corresponding organic light emitting diode under a low-luminance condition in which the magnitude of the driving current is very small, and therefore, a color dragging phenomenon may occur, in which the corresponding organic light emitting diode emits light later than organic light emitting diodes of other colors.

The above information disclosed in this Background section is only for enhancement of understanding of the background and therefore it may contain information that does not constitute prior art.

SUMMARY

Some example embodiments include a display device capable of removing or reducing a color dragging phenomenon by controlling an initialization voltage according to a luminance condition and a driving method of the display device.

According to some example embodiments of the present disclosure, a display device includes: a first pixel including a first organic light emitting diode; an initialization voltage generator configured to generate a first initialization voltage to be supplied to an anode of the first organic light emitting diode; and a timing controller including a first lookup table in which a plurality of first initialization voltage values corresponding to a plurality of maximum luminances are recorded, the timing controller being configured to determine a value of the first initialization voltage, based on reception information on a target maximum luminance and the first lookup table.

The plurality of first initialization voltage values may be obtained by adding first offset values to a value of a first power voltage to be supplied to a cathode of the first organic light emitting diode.

Each of the first offset values may be in inverse proportion to a magnitude of a corresponding maximum luminance.

The plurality of maximum luminances may include a reference maximum luminance. The first offset value at the reference maximum luminance may be 0.

The first offset value corresponding to a first maximum luminance group that exceeds the reference maximum luminance among the plurality of maximum luminances may be smaller than 0.

The first offset value corresponding to a second maximum luminance group that is less than the reference maximum luminance among the plurality of maximum luminances may be larger than 0.

The first power voltage may be in inverse proportion to the magnitude of the target maximum luminance.

The first power voltage may have a specific voltage value when the target maximum luminance corresponds to the reference maximum luminance, and have a voltage value lower than the specific voltage value when the target maximum luminance corresponds to the first maximum luminance group.

The first power voltage may have a voltage equal to or larger than the specific voltage value when the target maximum luminance corresponds to the second maximum luminance group.

A second power voltage supplied to the anode of the first organic light emitting diode may have a fixed value regardless of the target maximum luminance.

The display device may further include a second pixel including a second organic light emitting diode that has an organic material having a band gap different from that of an organic material of the first organic light emitting diode. The timing controller may further include a second lookup table in which a plurality of second initialization voltage values corresponding to the plurality of maximum luminances are recorded, and the timing controller may be configured to determine a value of a second initialization voltage, based on the reception information on the target maximum luminance and the second lookup table. The initialization voltage generator may be configured to generate the second initialization voltage to be supplied to an anode of the second organic light emitting diode.

The plurality of first initialization voltage values may be obtained by adding first offset values to a value of first power voltage to be supplied to a cathode of the first organic light emitting diode, and the plurality of second initialization voltage values may be obtained by adding second offset values to the value of the first power voltage to be supplied to a cathode of the second organic light emitting diode.

The plurality of maximum luminances may include a reference maximum luminance. The first offset value and the second offset value at the reference maximum luminance may be 0.

The first offset value corresponding to a first maximum luminance group that exceeds the reference maximum luminance among the plurality of maximum luminances may be smaller than 0, and the second offset value corresponding to the first maximum luminance group may be smaller than the first offset value.

The first offset value corresponding to a second maximum luminance group that is less than the reference maximum luminance among the plurality of maximum luminances may be larger than 0, and the second offset value corresponding to the second maximum luminance group may be smaller than the first offset value.

The first power voltage may have a specific voltage value when the target maximum luminance corresponds to the reference maximum luminance, and have a voltage value lower than the specific voltage value when the target maximum luminance corresponds to the first maximum luminance group.

The first power voltage may have a voltage equal to or larger than the specific voltage value when the target maximum luminance corresponds to the second maximum luminance group.

A second power voltage supplied to the anode of the first organic light emitting diode and the anode of the second organic light emitting diode may have a fixed value regardless of the target maximum luminance.

According to an aspect of the present disclosure, there is provided a method for driving a display device, the method including: receiving, by a timing controller, information on a target maximum luminance; determining, by the timing controller, a value of a first initialization voltage corresponding to the target maximum luminance with a first lookup table built therein; initializing, by an initialization voltage generator, an amount of charges accumulated in a first organic light emitting diode of a first pixel by supplying the first initialization voltage to an anode of the first organic light emitting diode; and allowing the first organic light emitting diode to emit light to correspond to a target gray scale having a luminance that is equal to or smaller than the target maximum luminance.

A plurality of first initialization voltage values corresponding to a plurality of maximum luminances may be recorded in the first lookup table. The plurality of first initialization voltage values may be obtained by adding first offset values to a value of a first power voltage to be supplied to a cathode of the first organic light emitting diode.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
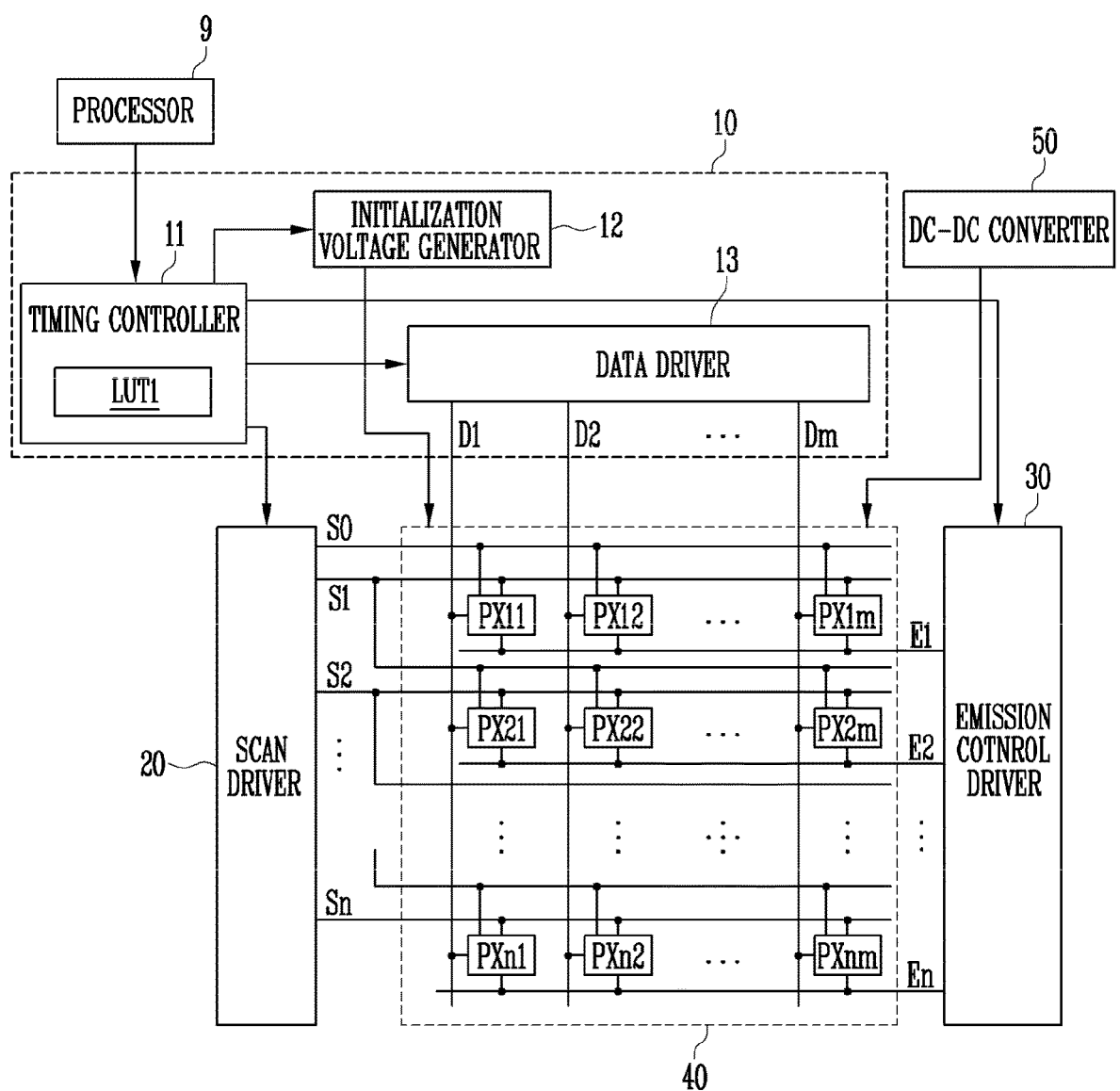
FIG. 1 is a diagram illustrating a display device according to some example embodiments of the present invention.

Hereinafter, aspects of some example embodiments are described in more detail with reference to the accompanying drawings so that those skilled in the art may easily practice the present disclosure. The present disclosure may be implemented in various different forms and is not limited to the example embodiments described in the present specification.

Certain irrelevant or repetitive description may be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

FIG. 1 is a diagram illustrating a display device according to some example embodiments of the present invention.

Referring to FIG. 1, the display device according to some example embodiments of the present invention includes a processor 9, a driver IC 10, a scan driver 20, an emission control driver 30, a pixel unit 40, and a DC-DC converter 50. The driver IC 10 may include a timing controller 11, an initialization voltage generator 12, and a data driver 13.

The processor 9 may be a general-purpose processing device. For example, the processor 9 may be an application processor (AP) of a mobile phone. As another example, the processor 9 may be a host system.

The processor 9 may supply a control signal and an image signal, which are required to display an image, to the driver IC 10. For example, the control signal may include a data enable signal, a vertical synchronization signal, a horizontal synchronization signal, a target maximum luminance, and the like.

The target maximum luminance may be a luminance at the maximum gray scale to be displayed in a current display device. When a gray scale of one pixel in an image signal for one frame is defined as unit image data, the unit image data may have, for example, 8 bits. When the unit image data has 8 bits, 256 gray scales may be expressed. The minimum gray scale (gray scale 0) may be darkest, and the maximum gray scale (gray scale 255) may be brightest. At this time, the brightness when all pixels of the pixel unit 40 emit light with the maximum gray scale may be defined as the target maximum luminance.

According to some example embodiments of the present invention, the unit of the target maximum luminance is designated as nit. That is, the pixel unit 40 may display an image that is partially (spatially) dark and bright according to image signals, or display an image that is dark and bright according to frames (times). However, the maximum brightness of the image is limited to the target maximum luminance.

The target maximum luminance may be manually set as a user manipulates the display device, or be automatically set using an algorithm linked with an illumination sensor, etc.

The timing controller 11 converts the control signal and the image signal, which are supplied from the processor 9, to be suitable for specifications of the driver IC 10, and supplies required control signals and image signals to the scan driver 20, the emission control driver 30, and the data driver 13.

In this embodiment, the timing controller 11 includes a first lookup table LUT1 in which a plurality of first initialization voltages corresponding to a plurality maximum luminances are recorded. The timing controller 11 may determine a value of the first initialization voltage, based on reception information on the target maximum luminance and the first lookup table LUT1. In some embodiments, the first lookup table LUT1 may exist at the outside of the timing controller 11.

The initialization voltage generator 12 may generate at least one initialization voltage. For example, the first initialization voltage may be supplied to an anode of an organic light emitting diode included in the pixel to initialize a quantity of charges accumulated in the organic light emitting diode. Also, for example, a third initialization voltage may be supplied to a gate terminal of a driving transistor included in the pixel to initialize a quantity of charges accumulated in the gate electrode of the driving transistor. In this embodiment, the third initialization voltage is not separately defined, but may have a fixed value. For example, the third initialization voltage may have a value equal to that of the first initialization voltage when a first offset value is 0.

In this embodiment, the initialization voltage generator 12 may generate a first initialization voltage having the determined value, and supply the generated first initialization voltage to an anode of a first organic light emitting diode of a first pixel. Further details of the first pixel, the first organic light emitting diode, and the first initialization voltage will be described in more detail later with reference to FIG. 2.

The data driver 13 generates a data voltage to be supplied to a plurality of data lines D1, D2, . . . , and Dm by receiving the control signal and the image signal from the timing controller 11. Data voltages generated in a unit of pixel rows may be simultaneously applied to the plurality of data lines D1, D2, . . . , and Dm according to an output control signal included in the control signal.

The scan driver 20 generates a scan signal to be supplied to a plurality of scan lines S1, S2, . . . , and Sn by receiving the control signal from the timing controller 11. In an embodiment, the scan driver 20 may sequentially supply the scan signal to the plurality of scan lines S1, S2, . . . , and Sn. For example, the control signal CONT1 may include a gate start pulse GSP and a plurality of gate cock signals, and the scan driver 20 may be configured in the form of a shift register to generate a scan signal in a manner that sequentially transfer the gate start pulse to a next stage circuit under the control of the gate clock signal.

The emission control driver 30 may supply an emission control signal for determining emission periods of the plurality of pixel circuits PX11, PX12, PX1m, PX21, PX22, PX2m, PXn1, PXn2, . . . , and PXnm to emission control lines E1, E2, . . . , and En. For example, each pixel circuit may include an emission control transistor, and the flow of current through the organic light emitting diode may be determined according to on/off of the emission control transistor, so that the emission of the organic light emitting diode is controlled. In some embodiments, the emission control driver 30 may be configured as a sequential emission type emission control driver that allows light to be sequentially emitted from each of the pixel rows. In another embodiment, the emission control driver 30 may be configured as a simultaneous emission type emission control driver that allows light to be simultaneously emitted from all of the pixel rows.

The DC-DC converter 50 may generate a plurality of power voltages, using supply power. For example, the DC-DC converter 50 may generate a first power voltage and a second power voltage, which are to be used in each pixel. In this embodiment, the first power voltage is smaller than the second power voltage. In the first embodiment of FIG. 1, it is illustrated that the initialization voltage generator 12 is separated from the DC-DC converter 50. However, in another embodiment, the initialization voltage generator 12 may be built in the DC-DC converter 50. In still another embodiment, at least a portion of the DC-DC converter 50 may be built in the driver IC 10.

The pixel unit 40 may include a plurality of pixel circuits PX11, PX12, . . . , PX1m, PX21, PX22, . . . , PX2m, . . . , PXn1, PXn2, . . . , and PXnm. Each pixel circuit may be coupled to a corresponding data line and a corresponding scan line, and receive a data voltage input corresponding to a scan signal. Each pixel circuit allows an organic light emitting diode to emit light, corresponding to the input data voltage, and accordingly, the pixel unit 40 displays an image screen.

Figure 2:
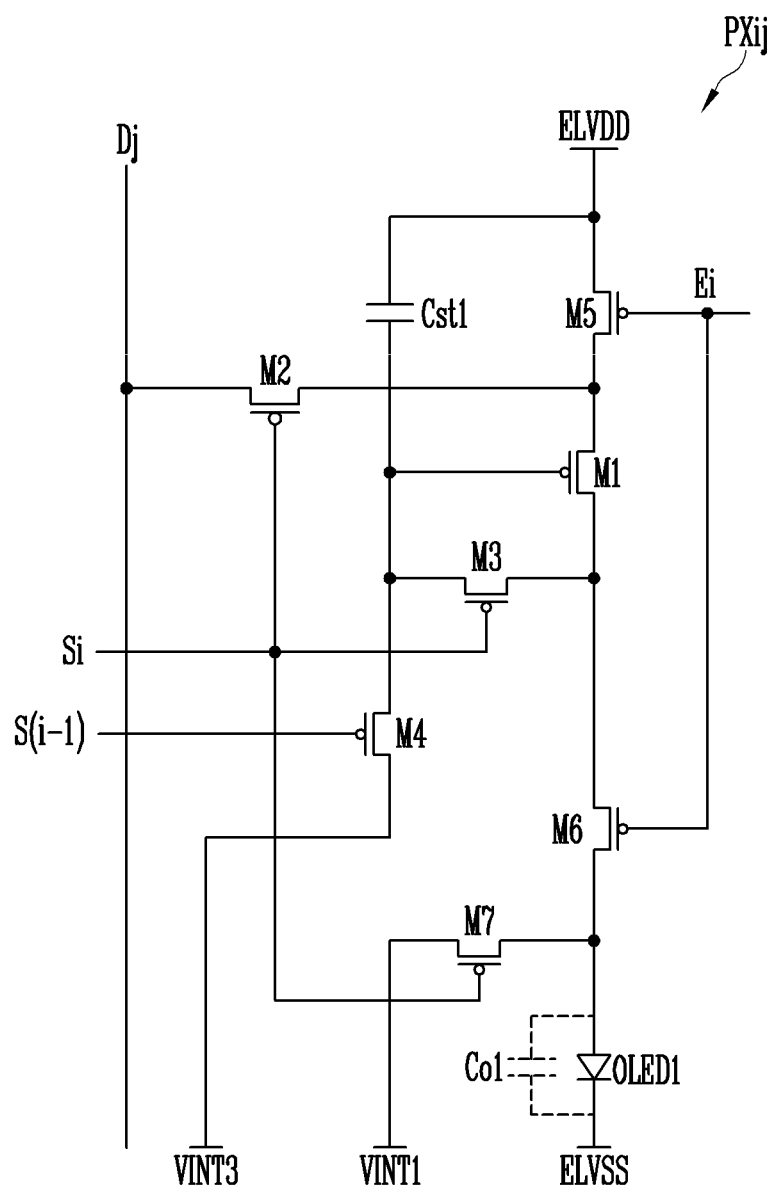
FIG. 2 is a diagram illustrating a first pixel according to some example embodiments of the present invention.

FIG. 2 is a diagram illustrating the first pixel according to some example embodiments of the present invention.

Referring to FIG. 2, the first pixel PXij includes a plurality of transistors M1, M2, M3, M4, M5, M6, and M7, a storage capacitor Cst1, and a first organic light emitting diode OLED1.

Hereinafter, a circuit configured with a P-type transistor is described as an example. However, those skilled in the art may design a circuit configured with an N-type transistor by changing the polarity of a voltage applied to a gate terminal thereof. Similarly, those skilled in the art may design a circuit configured with a combination of P-type and N-type transistors. The P-type transistor is commonly called as a transistor in which the amount of current flowing therethrough increases when the difference in voltage between a gate terminal and a source terminal increases in a negative direction. The N-type transistor is commonly called as a transistor in which the amount of current flowing therethrough increases when the difference in voltage between a gate terminal and a source terminal increases in a positive direction. The transistor may be configured in various forms such as a thin film transistor (TFT), a field effect transistor (FET), and a bipolar junction transistor (BJT).

One electrode of the transistor M1 may be coupled to the other electrode of the transistor M5, the other electrode of the transistor M1 may be coupled to one electrode of the transistor M6, and a gate electrode of the first transistor M1 may be coupled to the other electrode of the storage capacitor Cst1. The transistor M1 may be called as a first driving transistor. The transistor M1 determines an amount of driving current flowing between a second power voltage ELVDD and the first power voltage ELVSS according to a potential difference between the gate electrode and a source electrode thereof.

One electrode of the transistor M2 may be coupled to a data line Dj, the other electrode of the transistor M2 may be coupled to the one electrode of the transistor M1, and a gate electrode of the transistor M2 may be coupled to a scan line Si of a current stage. The transistor M2 may be called as a first scan transistor. If a scan signal of a turn-on level is applied to the scan line Si of the current stage, the transistor M2 allows a data voltage of the data line Dj to be applied to the first pixel PXij.

One electrode of the transistor M3 may be coupled to the other electrode of the first electrode M1, the other electrode of the transistor M3 may be coupled to the gate electrode of the first transistor M1, and a gate electrode of the transistor M3 may be coupled to the scan line Si of the current stage. If the scan signal of the turn-on level is applied to the scan line Si of the current stage, the transistor M3 may allow the transistor M1 to be diode-coupled.

One electrode of the transistor M4 may be coupled to the gate electrode of the transistor M1, the other electrode of the transistor M4 may be coupled to a third initialization voltage VINT3, and a gate electrode of the transistor M4 may be coupled to a scan line S(i−1) of a previous stage. In another embodiment, the gate electrode of the transistor M4 may be coupled to another scan line. If the scan signal of the turn-on level is applied to the scan line S(i−1) of the previous stage, the transistor M4 allows a quantity of charges accumulated in the gate electrode of the transistor M1 to be initialized by supplying the third initialization voltage VINT3 to the gate electrode of the transistor M1.

One electrode of the transistor M5 may be coupled to the second power voltage ELVDD, the other electrode of the transistor M5 may be coupled to the one electrode of the transistor M1, and a gate electrode of the transistor M5 may be coupled to an emission control line Ei. The one electrode of the transistor M6 may be coupled to the other electrode of the transistor M1, the other electrode of the transistor M6 may be coupled to an anode of the first organic light emitting diode OLED1, and a gate electrode of the transistor M6 may be coupled to the emission control line Ei. The transistors M5 and M6 may be called as emission control transistors. If an emission control signal of the turn-on level is applied to the emission control line Ei, the transistors M5 and M6 allow the first organic light emitting diode OLED1 to emit light by forming a current path between the second power voltage ELVDD and the first power voltage ELVSS.

One electrode of the transistor M7 may be coupled to the anode electrode of the first organic light emitting diode OLED1, the other electrode of the transistor M7 may be coupled to a first initialization voltage VINT1, and a gate electrode of the transistor M7 may be coupled to the scan line Si of the current stage. In another embodiment, the gate electrode of the transistor M7 may be coupled to another scan line. If the scan line of the turn-on level is applied to the scan line Si of the current stage, the transistor M7 allows a quantity of charges accumulated in the first organic light emitting diode OLED1 to be initialized by supplying the first initialization voltage VINT1 to the anode of the first organic light emitting diode OLED1.

The anode of the first organic light emitting diode OLED1 may be coupled to the other electrode of the transistor M6, and a cathode of the first organic light emitting diode OLED1 may be coupled to the first power voltage ELVSS. In FIG. 2, a capacitance Co1 may be illustrated so as to describe the quantity of charges accumulated in the first organic light emitting diode OLED1.

Figure 3:
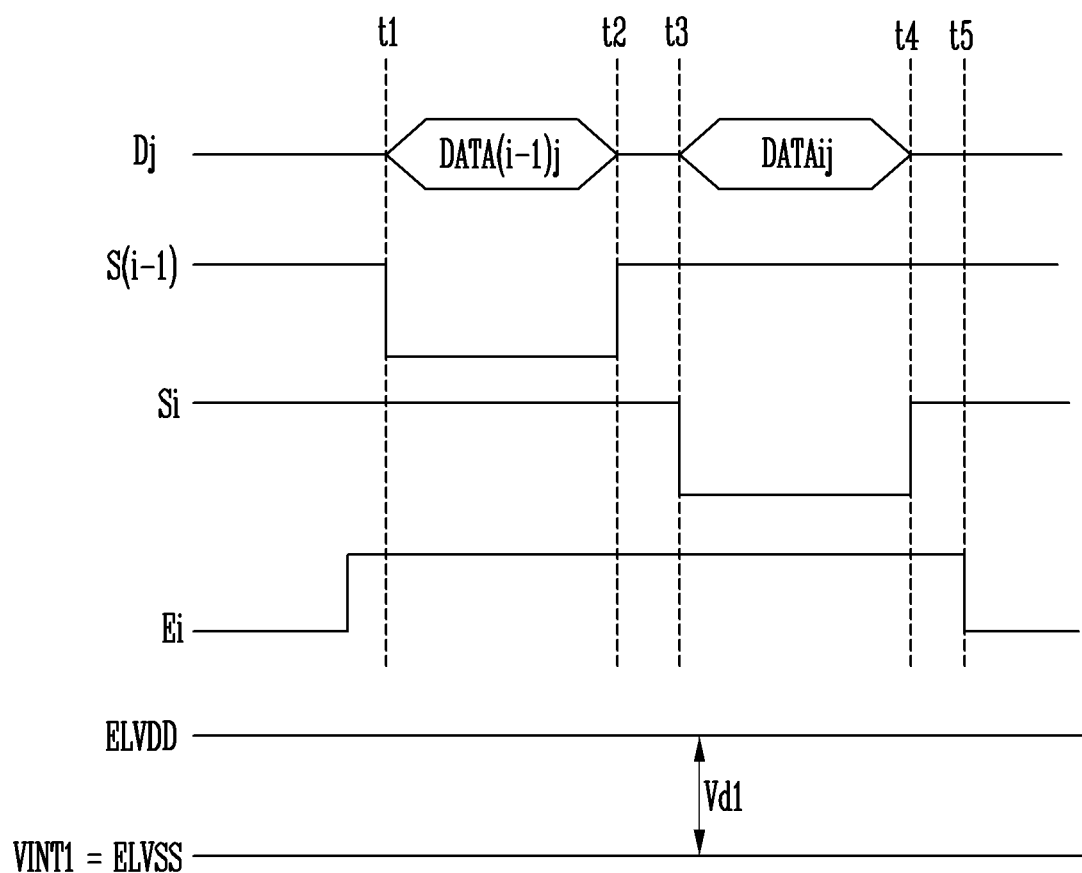
FIG. 3 is a diagram illustrating a first initialization voltage when a target maximum luminance is equal to a reference maximum luminance according to some example embodiments of the present invention.

FIG. 3 is a diagram illustrating the first initialization voltage when a target maximum luminance is equal to a reference maximum luminance in the first embodiment.

As described above, the first initialization voltage VINT1 is generated from the initialization voltage generator 12. In this embodiment, the first initialization voltage VINT1 may be varied depending on a target maximum luminance L_tar. For example, the timing controller 11 may search for a first initialization voltage value corresponding to the target maximum luminance L_tar among a plurality of first initialization voltages values corresponding to the plurality of maximum luminances of the first lookup table LUT1 and transfer the searched first initialization voltage value to the initialization voltage generator 12. The initialization voltage generator 12 may generate the first initialization voltage VINT1 according to the transferred first initialization voltage value.

In this embodiment, the plurality of first initialization voltage values are obtained by adding first offset values OFFSET1 to a value of the first power voltage ELVSS. Each of the first offset values OFFSET1 may be approximately in inverse proportion to the magnitude of a corresponding maximum luminance.

The plurality of maximum luminances of the first lookup table LUT1 may include a reference maximum luminance L_ref. The first offset value OFFSET1 at the reference maximum luminance L_ref may be 0. That is, when the target maximum luminance L_tar is equal to the reference maximum luminance L_ref, the value of the first power voltage ELVSS may be substantially equal to the value of the first initialization voltage VINT1.

In FIG. 3, a driving method of the first pixel PXij of FIG. 2 will be described by giving, as an example, a case where the target maximum luminance L_tar corresponds to the reference maximum luminance L_ref.

At a time t1, a data voltage DATA(i−1)j of a pixel row of the previous stage is applied to the data line Dj, and a scan signal of a turn-on level (low level) is applied to the scan line S(i−1) of the previous stage.

Because a scan signal of a turn-off level (high level) is applied to the scan line Si of the current stage, the transistor M2 is in a turn-off state, and the data voltage DATA(i−1)j of the pixel row of the previous stage is prevented from being applied to the first pixel PXij.

At this time, because the transistor M4 is in a turn-on state, the third initialization voltage VINT3 is applied to the gate electrode of the transistor M1, so that the quantity of charges accumulated in the gate electrode of the transistor M1 is initialized. Because an emission control signal of the turn-off level is applied to the emission control line Ei, the transistors M5 and M6 are in the turn-off state, and unnecessary emission of the first organic light emitting diode OLED due to the process of applying the third initialization voltage VINT3 is prevented.

At a time t2, because the transistor M4 is turned off as the scan signal of the turn-off level (high level) is applied to the scan line S(i−1) of the previous stage, the supply of the third initialization voltage VINT3 is stopped.

At a time t3, a data voltage DATAij of a pixel row of the current stage is applied, and the scan signal of the turn-on level is applied to the scan line Si of the current stage. Accordingly, the transistors M2, M1, and M3 are turned on, which make the data line Dj and the gate electrode of the transistor M1 electrically coupled to each other. Thus, the data voltage DATAij is applied to the other electrode of the storage capacitor Cst1, and the storage capacitor Cst1 accumulates a quantity of charges, which corresponds to the difference between the second power voltage ELVDD and the data voltage DATAij.

At this time, because the transistor M7 is in the turn-on state, the first initialization voltage VINT1 is applied to the anode of the first organic light emitting diode OLED1, and the first organic light emitting diode OLED1 is precharged with a quantity of charges, which corresponds to the difference between the first initialization voltage VINT1 and the first power voltage ELVSS. In this embodiment, the case of FIG. 3 is a case where the target maximum luminance L_tar is equal to the reference maximum luminance L_ref, and the first offset value OFFSET1 is 0. Therefore, because the first power voltage ELVSS is substantially equal to the first initialization voltage VINT1, there is no difference in voltage between both ends of the first organic light emitting diode OLED1, and the quantity of charges precharged in the first organic light emitting diode OLED1 becomes 0.

At a time t4, as the scan signal of the turn-off level is applied to the scan line Si of the current stage, the accumulation of charges in the storage capacitor Cst1 is ended, the accumulated charges are maintained, and the initialization of the first organic light emitting diode OLED1 is ended.

At a time t5, as the emission control signal of the turn-on level is applied to the emission control line Ei, the transistors M5 and M6 are turned on, and the amount of driving current flowing through the transistor M1 is controlled according to the quantity of charges accumulated in the storage capacitor Cst1, so that the driving current flows through the first organic light emitting diode OLED1. The driving current is charged in the capacitance Co1 of the first organic light emitting diode OLED1, and the first organic light emitting diode OLED1 that is completely charged emits light until before the emission control signal of the turn-off level is applied to the emission control line Ei.

The reference maximum luminance L_ref may be defined as a luminance when sufficient driving current flows to a degree where any color dragging phenomenon is not viewed. The reference maximum luminance L_ref may be individually set for each product. Thus, in FIG. 3, the color dragging phenomenon is not viewed even when the quantity of charges precharged in the first organic light emitting diode OLED1 is 0.

Figure 4:
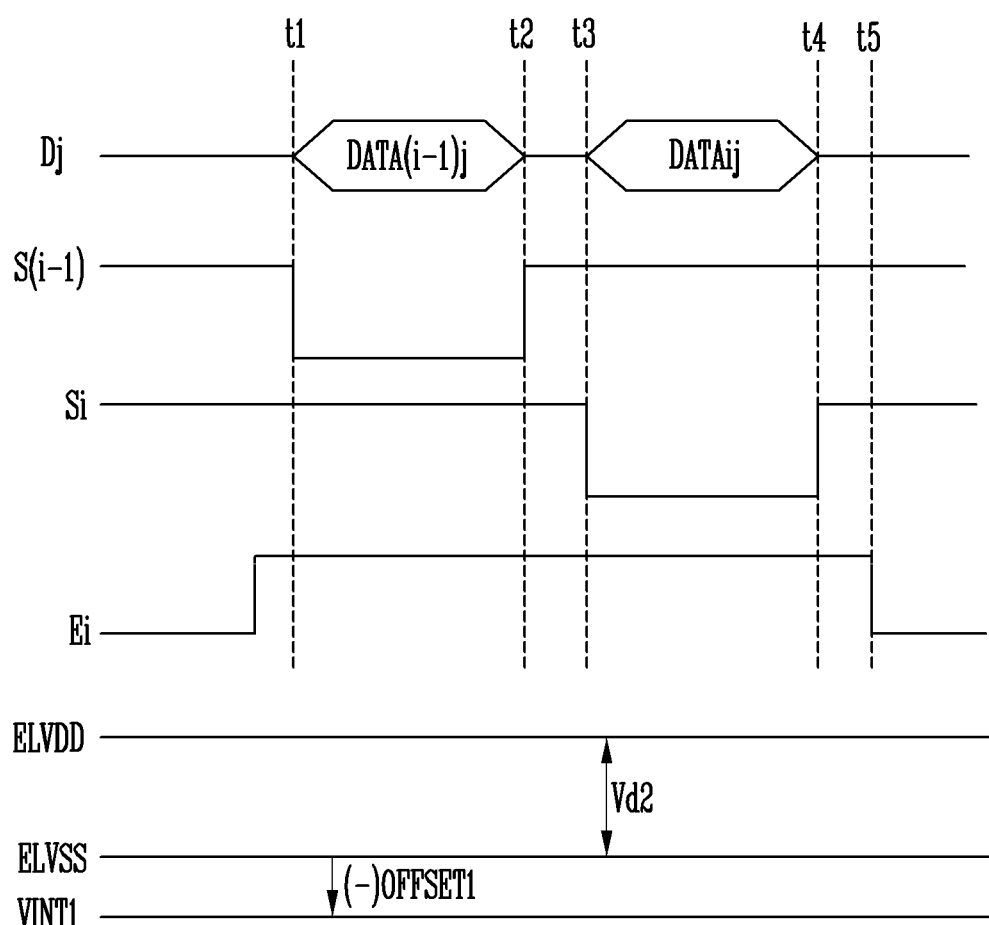
FIG. 4 is a diagram illustrating the first initialization voltage when the target maximum luminance is larger than the reference maximum luminance according to some example embodiments of the present invention.

FIG. 4 is a diagram illustrating the first initialization voltage when the target maximum luminance is larger than the reference maximum luminance in the first embodiment.

In FIG. 4, a driving method of the first pixel PXij is not different from that of FIG. 3, and therefore, repeated descriptions will be omitted.

The first lookup table LUT1 includes a first maximum luminance group that exceeds the reference maximum luminance L_ref among the plurality of maximum luminances, and the first offset value OFFSET1 corresponding to the first maximum luminance group is smaller than 0. The case of FIG. 4 is a case where the target maximum luminance L_tar corresponds to any one of the first maximum luminance group, i.e., a case where the target maximum luminance L_tar is larger than the reference maximum luminance L_ref.

Thus, in the case of FIG. 4, the first initialization voltage VINT1 is smaller than the first power voltage ELVSS.

The case of FIG. 4 is a case where the display device is set to emit light with a high luminance. At this time, the amount of driving current supplied to the first organic light emitting diode OLED1 is larger than that in the case of FIG. 3, and thus the color dragging phenomenon is not viewed. Accordingly, in the case of FIG. 4, a reversed voltage is applied to the first organic light emitting diode OLED1 to be initialized, so that the degradation of the first organic light emitting diode OLED1 can be delayed.

Figure 5:
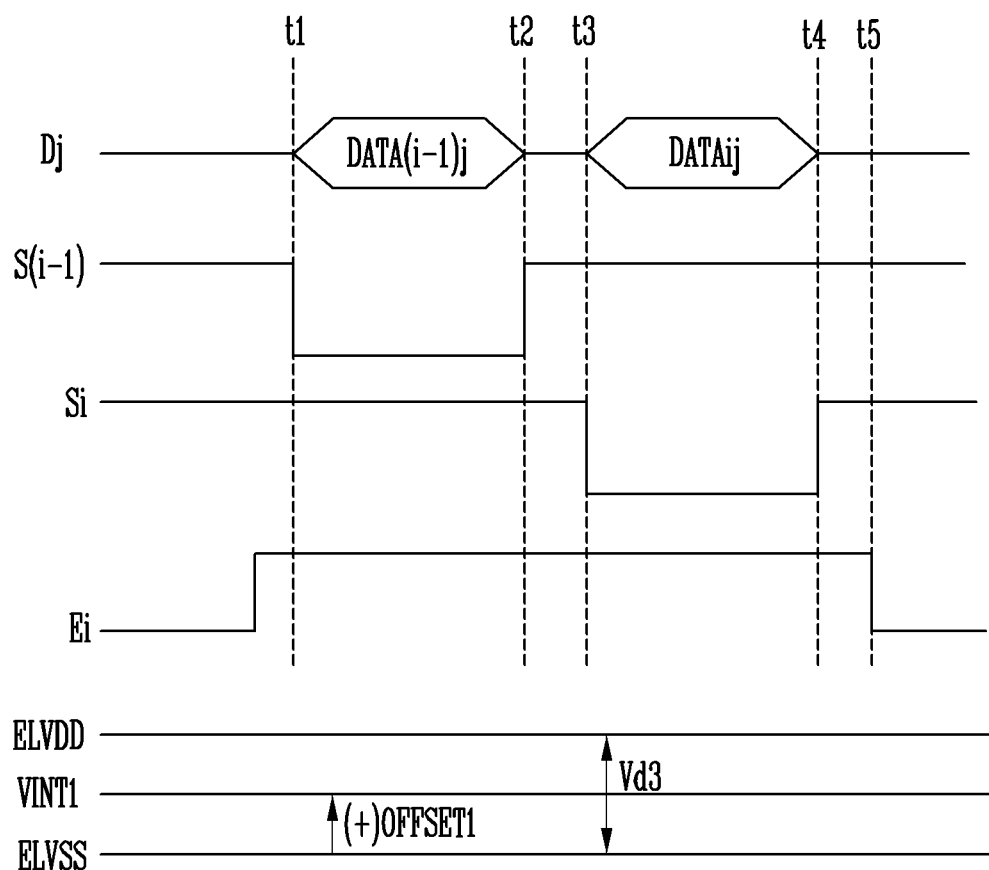
FIG. 5 is a diagram illustrating the first initialization voltage when the target maximum luminance is smaller than the reference maximum luminance according to some example embodiments of the present invention.

FIG. 5 is a diagram illustrating the first initialization voltage when the target maximum luminance is smaller than the reference maximum luminance in the first embodiment.

In FIG. 5, a driving method of the first pixel PXij is not different from that of FIG. 3, and therefore, repetitive descriptions will be omitted.

The first lookup table LUT1 includes a second maximum luminance group that is less than the reference maximum luminance L_ref among the plurality of maximum luminances, and the first offset value OFFSET1 corresponding to the second maximum luminance group is larger than 0. The case of FIG. 5 is a case where the target maximum luminance L_tar corresponds to any one of the second maximum luminance group, i.e., a case where the target maximum luminance L_tar is smaller than the reference maximum luminance L_ref.

Thus, in the case of FIG. 5, the first initialization voltage VINT1 is larger than the first power voltage ELVSS.

The case of FIG. 5 is a case where the display device is set to emit light with a low luminance. At this time, the amount of driving current supplied to the first organic light emitting diode OLED1 is smaller than that in the case of FIG. 3. Therefore, as the capacitance Co1 is slowly charged, the color dragging phenomenon may be viewed.

Accordingly, in the case of FIG. 5, the capacitance Co1 is pre-charged according to the first offset value OFFSET1 that is larger than 0 in a period of t3 to t4, so that, although a relatively small quantity of charges is supplied to the first organic light emitting diode OLED1 by the driving current at the time t5, the capacitance Co1 is completely charged at a target time, and the first organic light emitting diode OLED1 starts emitting light. Thus, the color dragging phenomenon is prevented.

Figure 6:
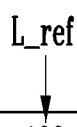
FIG. 6 is a diagram illustrating examples of a first initialization voltage, a first power voltage, and a second power voltage according to the target maximum luminance according to some example embodiments of the present invention.

FIG. 6 is a diagram illustrating examples of the first initialization voltage, the first power voltage, and the second power voltage according to the target maximum luminance.

Referring to FIG. 6, examples of the first offset value OFFSET1, the first power voltage ELVSS, and the second power voltage ELVDD according to the target maximum luminance L_tar are shown in Table 1. In Table 1, the unit of luminance is nit, and the unit of voltage is volt (V).

In FIG. 6, the first offset value OFFSET1 according to the target maximum luminance L_tar corresponds to that described with reference to FIGS. 3 to 5, and therefore, repeated descriptions will be omitted.

According to some example embodiments of the present invention, the first power voltage ELVSS may be approximately in inverse proportion to the magnitude of the target maximum luminance L_tar. At this time, the second power voltage ELVDD may have a fixed value regardless of the target maximum luminance L_tar. In FIG. 6, the second power voltage ELVDD is for example 4.6 V.

More specifically, the first power voltage ELVSS has a specific voltage value when the target maximum luminance L_tar corresponds to the reference maximum luminance L_ref. Also, the first power voltage ELVSS may have a voltage value lower than the specific voltage value when the target maximum luminance L_tar corresponds to the first maximum luminance group (i.e., under a high luminance condition). Also, the first power voltage ELVSS may have a voltage value equal to or higher than the specific voltage value when the target maximum luminance L_tar corresponds to the second maximum luminance group (i.e., under a low luminance condition). Referring to FIG. 6, the reference maximum luminance L_ref is for example 100 nit, and the specific voltage value of the first power voltage ELVSS is for example, −2.6 V.

According to some example embodiments of the present invention, under the high luminance condition, a potential difference Vd2 (see FIG. 4) between the second power voltage ELVDD and the first power voltage ELVSS is increased, so that the amount of driving current can be sufficiently ensured. Under the low luminance condition, a potential difference Vd3 (see FIG. 5) between the second power voltage ELVDD and the first power voltage ELVSS is decreased, so that reduction in power consumption can be achieved. At this time, a potential difference Vd1 (see FIG. 3) between the second power voltage ELVDD and the first power voltage ELVSS when the target maximum luminance L_tar is the reference maximum luminance L_ref becomes a reference.

In addition, as described above, the second power voltage ELVDD may have a fixed value regardless of the target maximum luminance L_tar. However, in another embodiment, the second power voltage ELVDD and the first power voltage ELVSS may be varied such that the difference between the second power voltage ELVDD and the first power voltage ELVSS is maintained as shown in FIG. 6.

Figure 7:
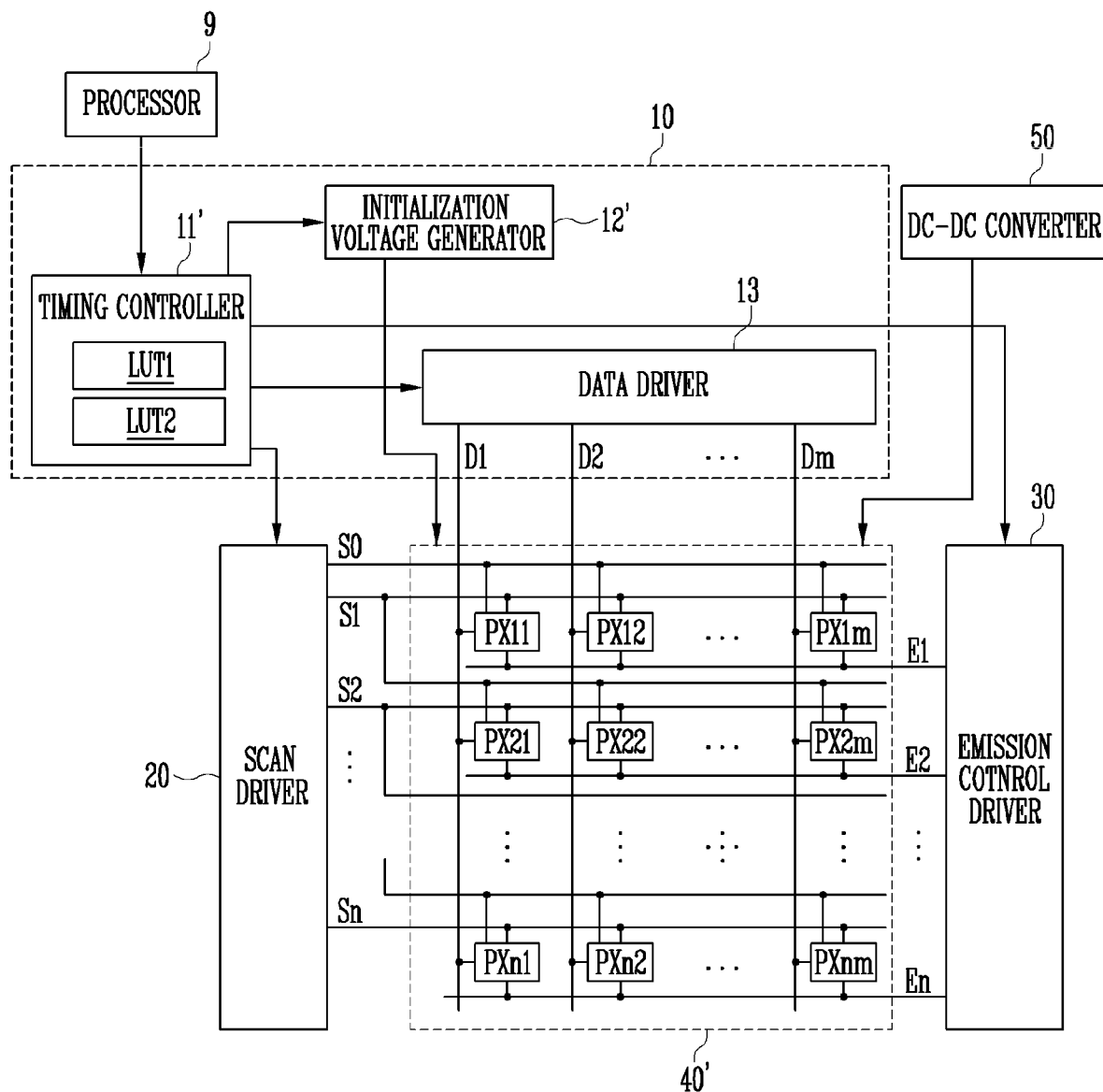
FIG. 7 is a diagram illustrating a display device according to some example embodiments of the present invention.

FIG. 7 is a diagram illustrating a display device according to some example embodiments of the present invention.

Referring to FIG. 7, the display device according to some example embodiments of the present invention includes a processor 9, a driver IC 10, a scan driver 20, an emission control driver 30, a pixel unit 40', and a DC-DC converter 50. The driver IC 10 may include a timing controller 11', an initialization voltage generator 12', and a data driver 13.

In the embodiment of FIG. 7, the timing controller 11' and the initialization voltage generator 12' are different from the timing controller 11 and the initialization voltage generator 12 in the embodiment of FIG. 1. The other components of the embodiment illustrated in FIG. 7 are substantially identical to those of the embodiment illustrated in FIG. 1, and therefore, repetitive descriptions will be omitted.

The pixel unit 40' includes a second pixel including a second organic light emitting diode that has an organic material having a band gap different from that of an organic material of the first organic light emitting diode OLED1.

The timing controller 11' further includes a second lookup table LUT2 in which a plurality of second initialization voltage values corresponding to a plurality of maximum luminances are recorded. The timing controller 11' determines a value of the second initialization voltage, based on reception information on the target maximum luminance L_tar and the second lookup table LUT2.

As described above, the plurality of first initialization voltage values are obtained by adding first offset values OFFSET1 to the value of the first power voltage ELVSS. In this embodiment, the plurality of second initialization voltage values are obtained by adding second offset values to the value of the first power voltage ELVSS. At this time, the first offset value OFFSET1 and the second offset value may be different from each other, except at the reference maximum luminance L_ref. This will be described in detail later with reference to FIGS. 12 to 14.

The initialization voltage generator 12' further generates a second initialization voltage to be supplied to an anode of the second organic light emitting diode.

Figure 8:
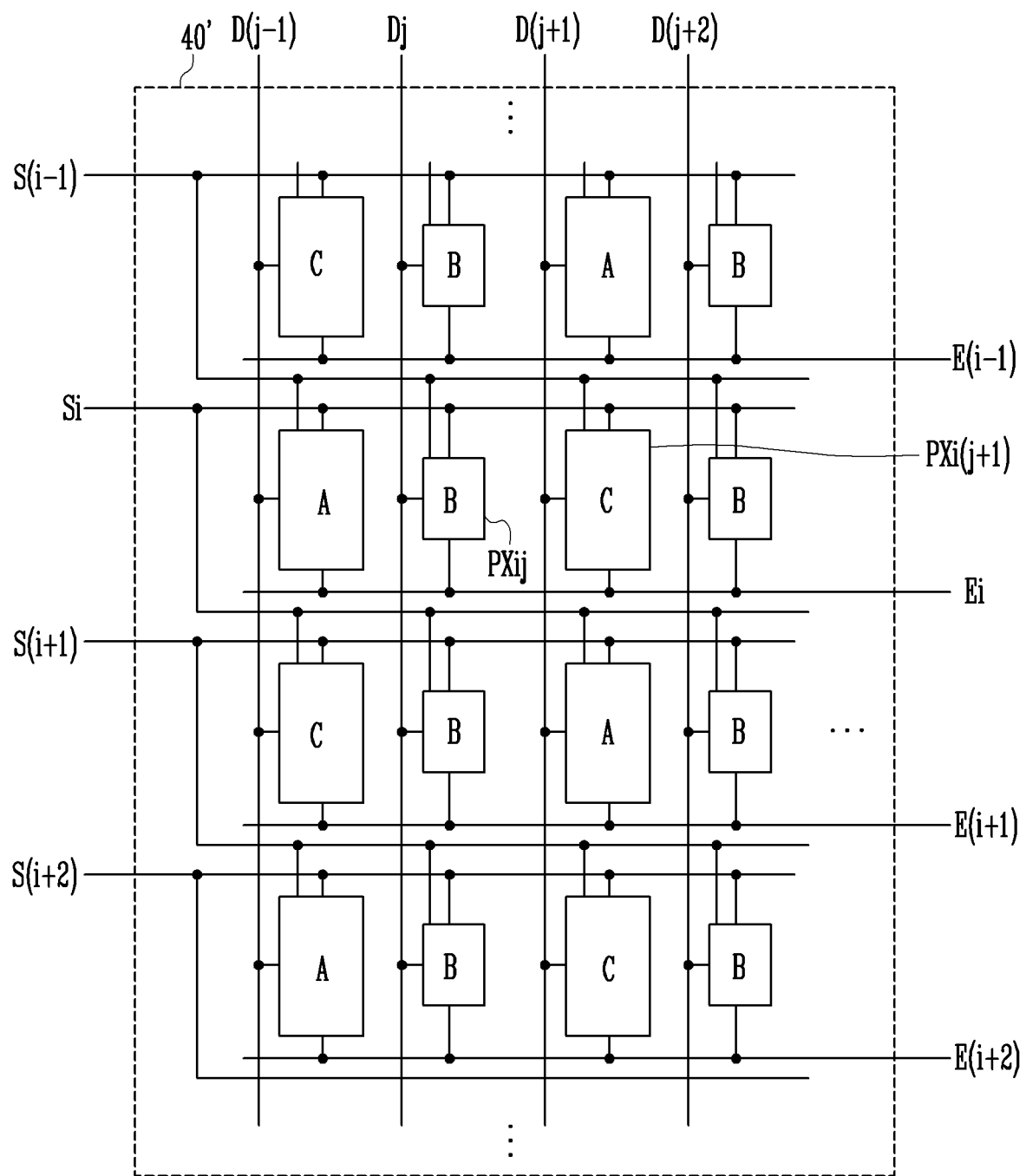
FIG. 8 is a diagram illustrating an embodiment of a pixel unit according to some example embodiments of the present invention.

FIG. 8 is a diagram illustrating an embodiment of the pixel unit according to some example embodiments of the present invention.

Referring to FIG. 8, a portion of the pixel unit 40' is enlarged and illustrated. The pixel unit 40' includes a first pixel PXij and a second pixel PXi(j+1). In FIG. 8, the first pixel PXij designates a pixel B and the second pixel PXi(j+1) designates a pixel C. However, the second pixel PXi(j+1) may designate a pixel A.

A first organic light emitting diode OLED1 of the pixel B may include an organic material with relatively high emission efficiency, i.e., showing high luminance emission as compared with energy consumption. A second organic light emitting diode OLED2 of the pixel A or C may include an organic material with relatively low emission efficiency, i.e., showing low luminance emission as compared with energy consumption. The organic light emitting diodes of the pixels A and C include organic materials having band gaps different from each other. However, the pixel B is an object to be compared herein, and therefore, the difference between the organic light emitting diodes of the pixels A and C is neglected for convenience.

Therefore, the first organic light emitting diode OLED1 may have a light emitting surface of which area is smaller than that of a light emitting surface of the second organic light emitting diode OLED2. Accordingly, a case where the pixel B has an area smaller than that of the pixel A or C is illustrated in FIG. 8.

A green organic light emitting diode may generally have the highest emission luminance as compared with energy consumption. Therefore, the first organic light emitting diode OLED1 may be the green organic light emitting diode. At this time, the second organic light emitting diodes OLED2 may be a red or blue organic light emitting diode. That is, the pixel B may be a green pixel, the pixel A is a red pixel, and the pixel C may be a blue pixel. In addition, the pixel B may be a green pixel, the pixel A is a blue pixel, and the pixel C may be a red pixel.

However, embodiments of the present disclosure are not limited thereto, and a new organic material having high emission efficiency may be developed. At this time, the first organic light emitting diode OLED1 may be, for example, a blue organic light emitting diode. At this time, the second organic light emitting diode may be a green or red organic light emitting diode.

Similarly, the first organic light emitting diode OLED1 may be, for example, a red organic light emitting diode. At this time, the second organic light emitting diode OLED2 may be a green or blue organic light emitting diode.

However, the first organic light emitting diode OLED1 is not necessarily determined according to the emission efficiency. Referring to FIG. 8, the sum of the number of pixels A and the number of pixels C is substantially equal to the number of pixels B. Therefore, if emission efficiencies of organic materials are similar to one another, the areas of the light emitting surfaces as shown in FIG. 8 may be determined to control the emission area of each color.

The structure of the pixel unit 40' shown in FIG. 8 may be referred to as a pentile structure.

Figure 9:
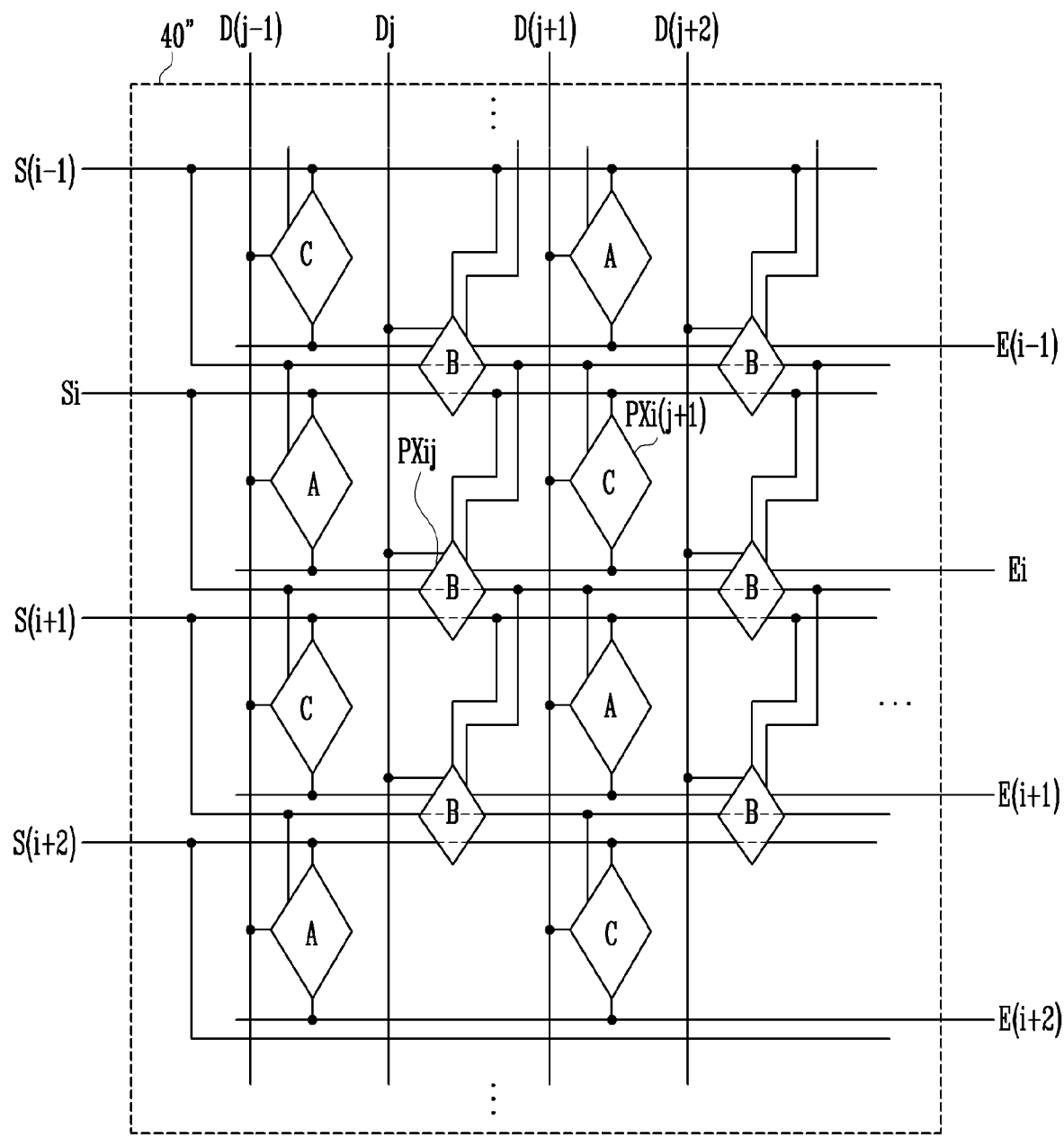
FIG. 9 is a diagram illustrating another embodiment of the pixel unit according to some example embodiments of the present invention.

FIG. 9 is a diagram illustrating another example of the pixel unit according to some example embodiments of the present invention.

The pixel unit 40" of FIG. 9 is identical to the pixel unit 40' of FIG. 8 in terms of the electrical coupling relationship and configuration of pixel circuits, and therefore, repetitive descriptions will be omitted.

Unlike the pixel unit 40' of FIG. 8, in the pixel unit 40" of FIG. 9, the light emitting surface of each pixel may be provided in a diamond shape or a rhombus shape. The structure of the pixel unit 40" of FIG. 9 may be referred to as a diamond pentile structure.

Figure 10:
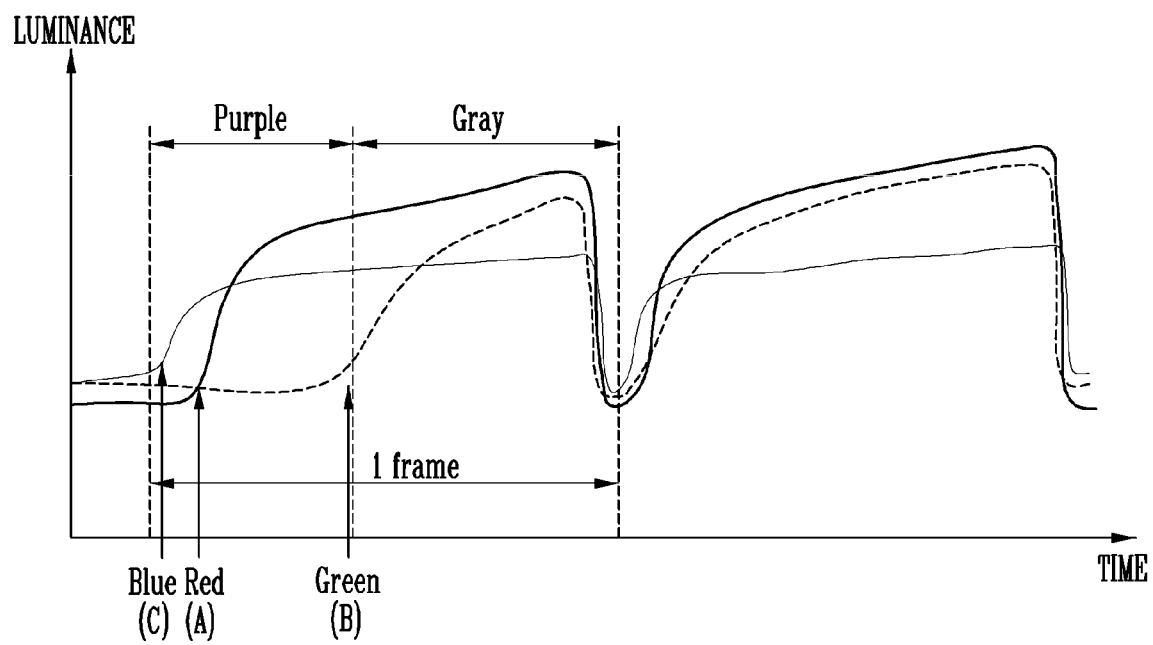
FIG. 10 is a diagram illustrating a color dragging phenomenon.

FIG. 10 is a diagram illustrating a color dragging phenomenon that occurs when embodiments of the present disclosure are not applied.

Referring to FIG. 10, when embodiments of the present disclosure are not applied, differences in emission time between pixels A, B, and C are illustrated.

For example, in order to express gray, lights emitted from the organic light emitting diodes of the pixels A, B, and C are to be combined when the luminance of each of the lights reaches a certain level.

However, in the structures of the pixel units 40' and 40" shown in FIGS. 8 and 9, the capacitance of the first organic light emitting diode OLED1 of the pixel B per unit area may be large, and the amount of driving current flowing through the first organic light emitting diode OLED1 of the pixel B may be small. Therefore, as shown in FIG. 10, the emission time of the pixel B may be later than those of the pixels A and C.

For this reason, only the pixels A and C may emit light at an initial period. If the pixel A is a red pixel and the pixel C is a blue pixel, the color viewed by a user may be purple. Therefore, the user may experience a color dragging phenomenon that purple is first viewed when the user scrolls a gray screen.

Figure 11:
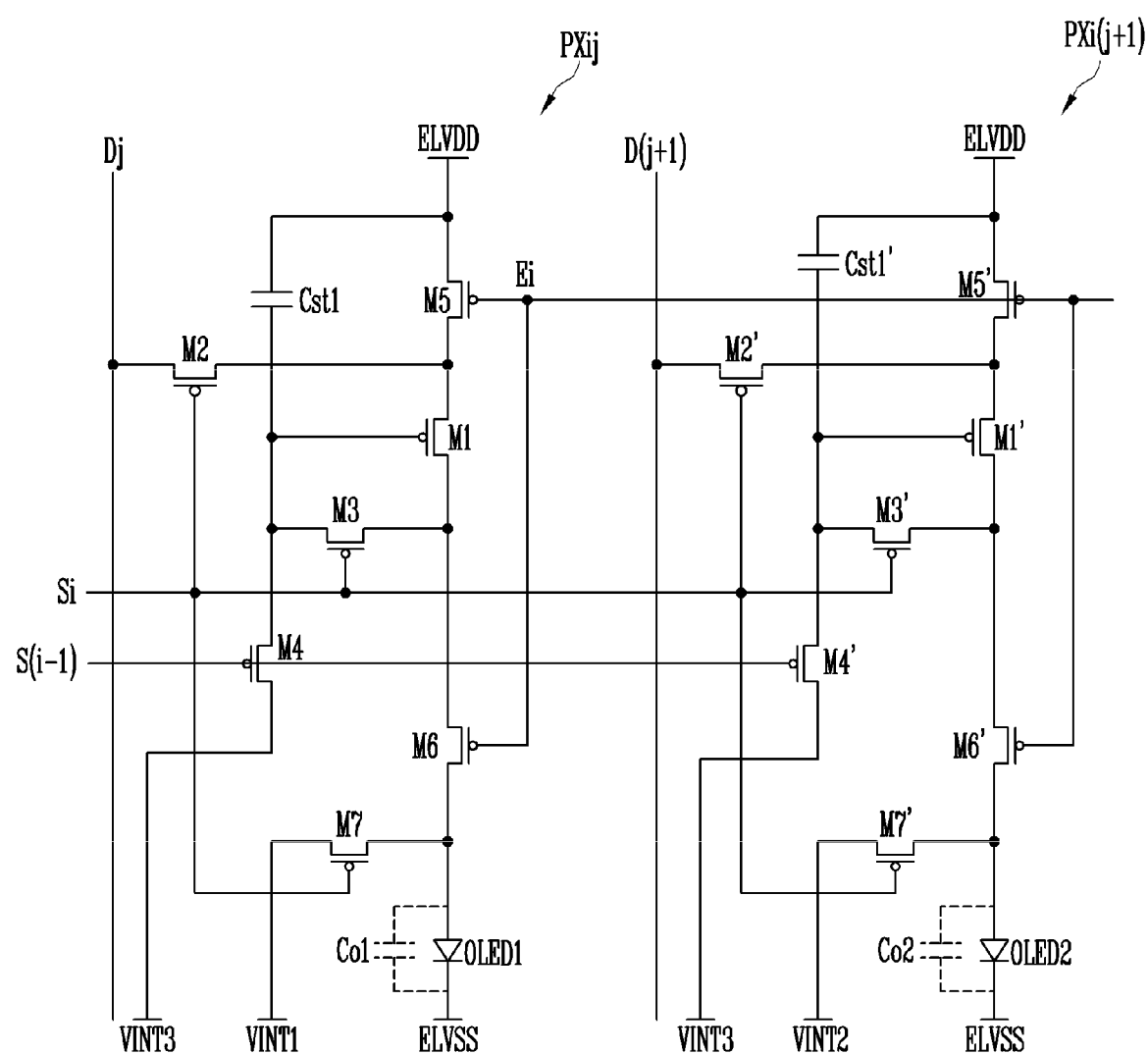
FIG. 11 is a diagram illustrating a first pixel and a second pixel according to some example embodiments of the present invention.

FIG. 11 is a diagram illustrating the first pixel and the second pixel according to some example embodiments of the present invention.

Referring to FIG. 11, the first pixel PXij includes a plurality of transistors M1, M2, M3, M4, M5, M6, and M7, a storage capacitor Cst1, and a first organic light emitting diode OLED1. The first pixel PXij of FIG. 11 is identical to the first pixel PXij of FIG. 2, and therefore, repetitive descriptions will be omitted.

The second pixel circuit PXi(j+1) includes a plurality of transistors M1', M2', M3', M4', M5', M6', and M7', a storage capacitor Cst1', and a second organic light emitting diode OLED2. In the second pixel circuit PXi(j+1), overlapping descriptions of components corresponding to those of the first pixel PXij will be omitted.

The second pixel circuit PXi(j+1) is different from the first pixel PXij in that one electrode of the transistor M2' is coupled to a data line D(j+1) and a second initialization voltage VINT2 is applied to the other electrode of the transistor M7'.

As described above, since the first organic light emitting diode OLED1 of the first pixel PXij has an emission efficiency higher than that of the second organic light emitting diode OLED2, a relatively small amount of driving current flows as compared with the second pixel circuit PXi(j+1).

Accordingly, under a low luminance condition in which a very small amount of driving current flows, the time required to charge a capacitance Co1 of the first organic light emitting diode OLED1 is later than that required to charge a capacitance Co2 of the second organic light emitting diode OLED2, and therefore, a color dragging phenomenon may occur as shown in FIG. 10.

A driving method for preventing the color dragging phenomenon will be described in FIGS. 12 to 14.

Figure 12:
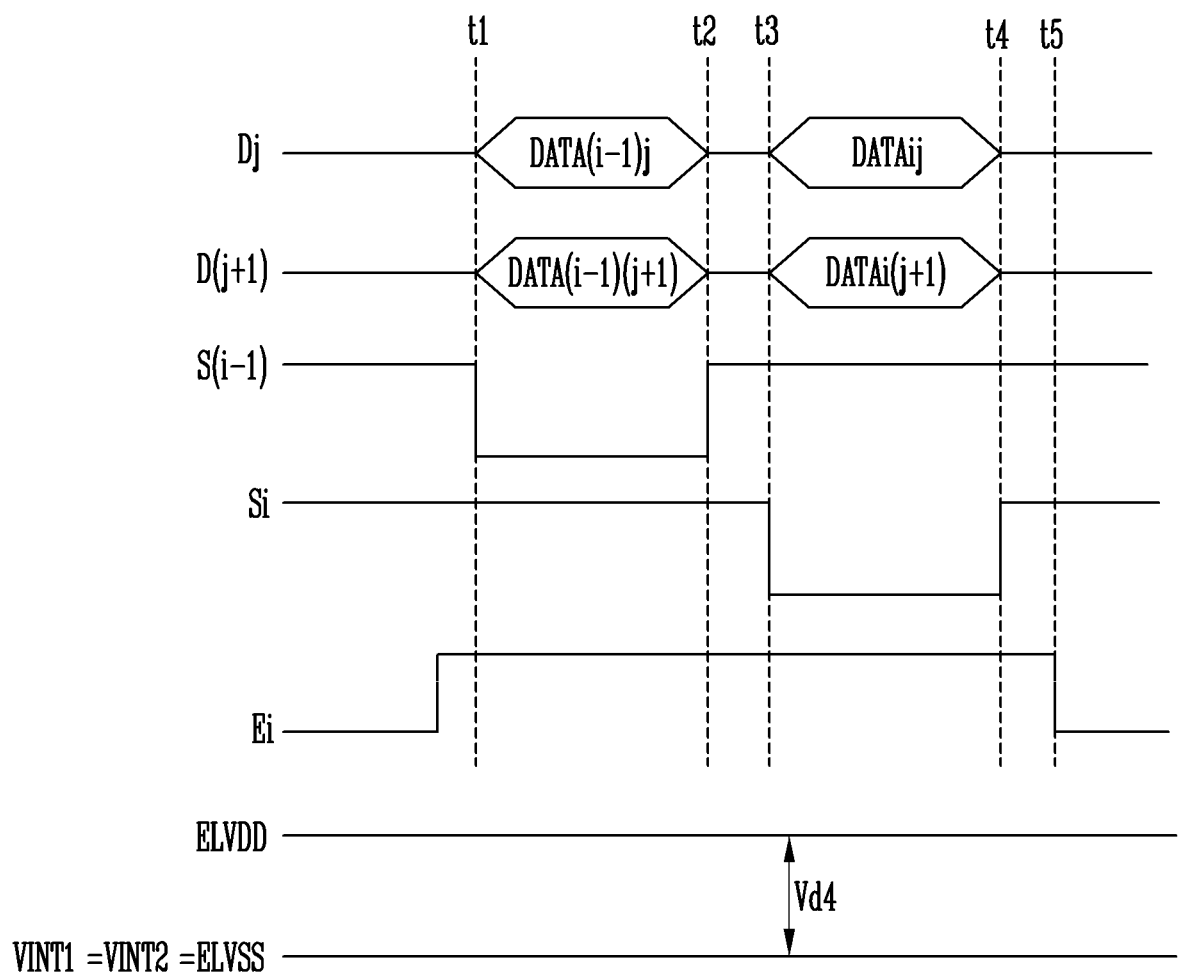
FIG. 12 is a diagram illustrating a first initialization voltage and a second initialization voltage when a target maximum luminance is equal to a reference maximum luminance according to some example embodiments of the present invention.

FIG. 12 is a diagram illustrating the first initialization voltage and the second initialization voltage when the target maximum luminance is equal to the reference maximum luminance.

In FIG. 12, a driving method of the first pixel PXij and the second pixel PXi(j+1) is substantially identical to that of FIG. 3, and therefore, repetitive descriptions will be omitted.

In the reference maximum luminance L_ref, a first offset value OFFSET1 and a second offset value OFFSET2 may be 0. That is, when the target maximum luminance L_tar is equal to the reference maximum luminance L_ref, the first initialization voltage VINT1, the second initialization voltage VINT2, and the first power voltage ELVSS may be substantially equal to one another.

At this time, in the period of t3 to t4, the potential difference between both ends of each of the first organic light emitting diode OLED1 and the second organic light emitting diode OLED2 is 0 V, and hence the quantity of charges precharged in each of the first organic light emitting diode OLED1 and the second organic light emitting diode OLED2 becomes 0.

As described above, the reference maximum luminance L_ref may be defined as a luminance when a sufficient driving current flows to a degree where any color dragging phenomenon is not viewed. Thus, in FIG. 12, the color dragging phenomenon is not viewed even when the quantity of charges precharged in the first organic light emitting diode OLED1 and the second organic light emitting diode OLED2 is 0.

The first power voltage ELVSS may have a specific voltage value when the target maximum luminance L_tar corresponds to the reference maximum luminance L_ref. In addition, the second power voltage ELVDD may have a fixed value regardless of the target maximum luminance L_tar. At this time, a potential difference Vd4 between the second power voltage ELVDD and the first power voltage ELVSS becomes a reference of FIGS. 13 and 14 which will be described later.

Figure 13:
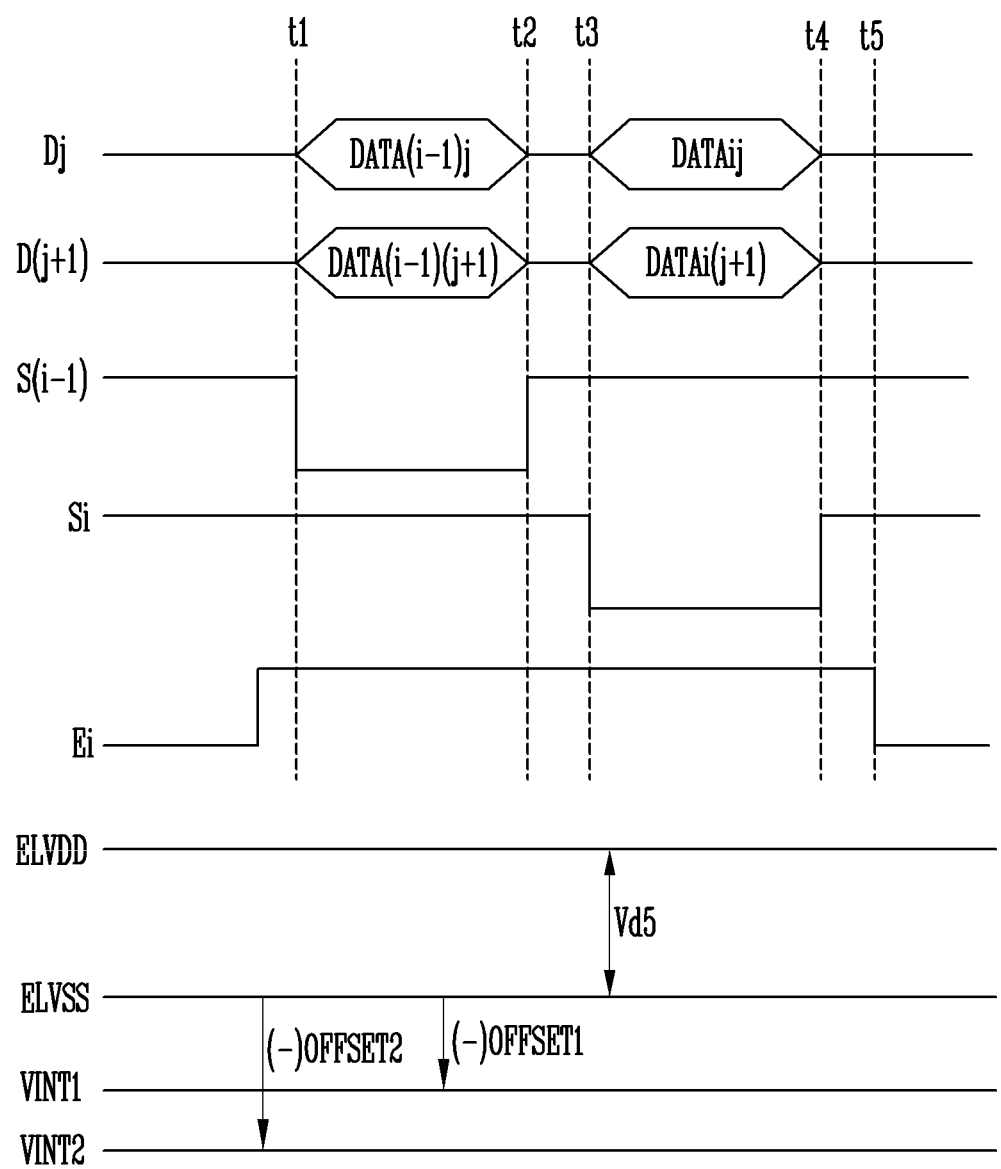
FIG. 13 is a diagram illustrating the first initialization voltage and the second initialization voltage when the target maximum luminance is larger than the reference maximum luminance according to some example embodiments of the present invention.

FIG. 13 is a diagram illustrating the first initialization voltage and the second initialization voltage when the target maximum luminance is larger than the reference maximum luminance in the second embodiment.

As described above, the first lookup table LUT1 includes a first maximum luminance group that exceeds the reference maximum luminance L_ref among the plurality of maximum luminances, and the first offset value OFFSET1 corresponding to the first maximum luminance group is smaller than 0. The case of FIG. 13 is a case where the target maximum luminance L_tar corresponds to any one of the first maximum luminance group, i.e., a case where the target maximum luminance L_tar is larger than the reference maximum luminance L_ref.

In this embodiment, the second lookup table LUT2 includes a second offset value OFFSET2 corresponding to the first maximum luminance group. The second offset value OFFSET2 corresponding to the first maximum luminance group is smaller than a corresponding first offset value OFFSET1.

Thus, in the case of 13, the first initialization voltage VINT1 is smaller than the first power voltage ELVSS, and the second initialization voltage VINT2 is smaller than the first initialization voltage VINT1 and the first power voltage ELVSS.

The case of FIG. 13 is a case where the display device is set to emit light with a high luminance. At this time, the amount of driving current supplied to the first organic light emitting diode OLED1 and the second organic light emitting diode OLED2 is larger than that in the case of FIG. 12, and thus the color dragging phenomenon is not viewed. Accordingly, in the case of FIG. 13, a reversed voltage is applied to the first organic light emitting diode OLED1 and the second organic light emitting diode OLED2 to be initialized, so that the degradation of the first organic light emitting diode OLED1 and the second organic light emitting diode OLED2 can be delayed.

In addition, the first initialization voltage VINT1 is set larger than the second initialization voltage VINT2, so that the capacitance Co1 of the first organic light emitting diode OLED1 can be precharged with a voltage higher than that of the capacitance Co2 of the second organic light emitting diode OLED2. Thus, at the time t5, the emission start time of the first organic light emitting diode OLED1 can be brought further forward than that of the second organic light emitting diode OLED2. Accordingly, referring to FIG. 10, the interval between emission start times of the pixels A and C and the pixel B can be reduced.

The first power voltage ELVSS may have a voltage value lower than the specific voltage value when the target maximum luminance L_tar corresponds to the first maximum luminance group. That is, a potential difference Vd5 may be larger than that Vd4 of FIG. 12, and thus a driving current necessary for high-luminance driving can be ensured.

Figure 14:
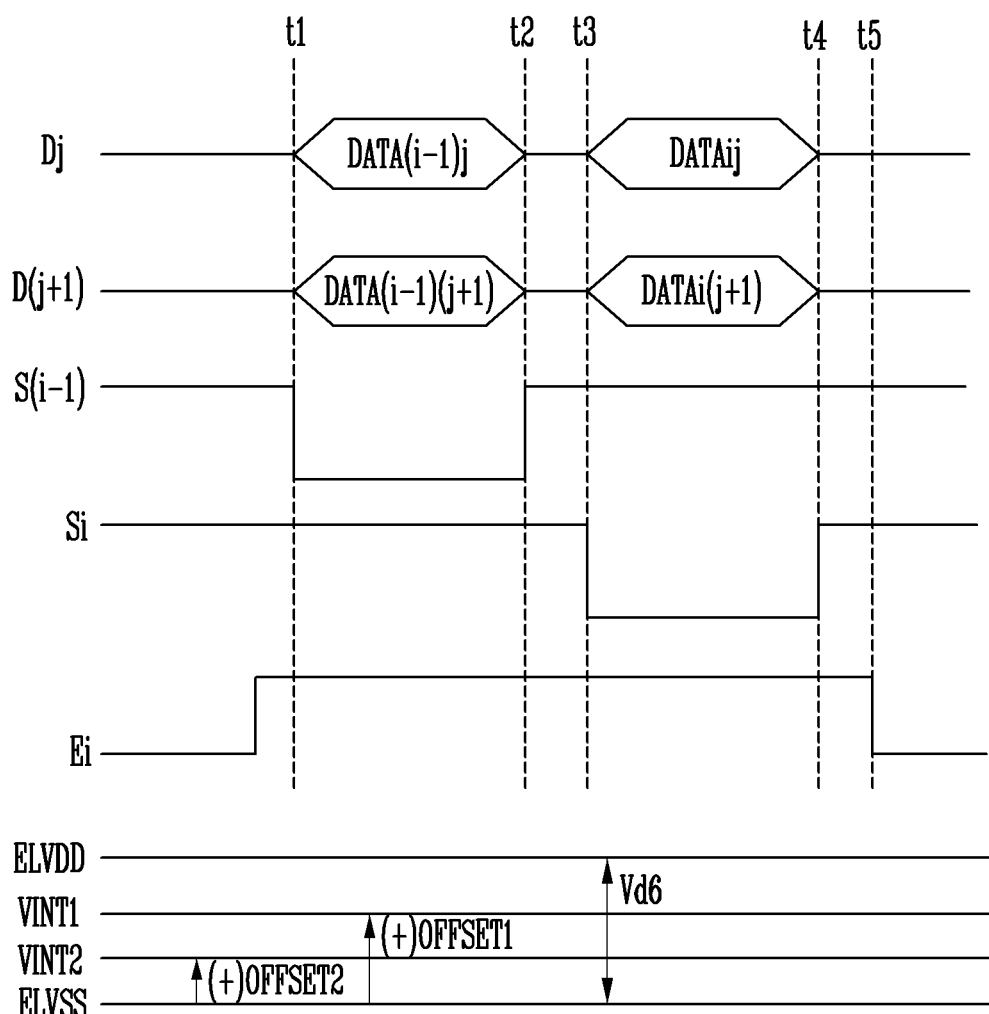
FIG. 14 is a diagram illustrating the first initialization voltage and the second initialization voltage when the target maximum luminance is smaller than the reference maximum luminance according to some example embodiments of the present invention.

FIG. 14 is a diagram illustrating the first initialization voltage and the second initialization voltage when the target maximum luminance is smaller than the reference maximum luminance in the second embodiment.

As described above, the first lookup table LUT1 includes a second maximum luminance group that is less than the reference maximum luminance L_ref among the plurality of maximum luminances, and the first offset value OFFSET1 corresponding to the second maximum luminance group is larger than 0. The case of FIG. 14 is a case where the target maximum luminance L_tar corresponds to any one of the second maximum luminance group, i.e., a case where the target maximum luminance L_tar is smaller than the reference maximum luminance L_ref.

In this embodiment, the second lookup table LUT2 includes a second offset value OFFSET2 corresponding to the second maximum luminance group. The second offset value OFFSET2 corresponding to the second maximum luminance group is smaller than a corresponding first offset value OFFSET1.

Thus, in the case of 14, the first initialization voltage VINT1 is larger than the first power voltage ELVSS, and the second initialization voltage VINT2 is smaller than the first initialization voltage VINT1. In addition, the second initialization voltage VINT2 may be larger than the first power voltage ELVSS.

The case of FIG. 14 is a case where the display device is set to emit light with a low luminance. At this time, the amount of driving current supplied to the first organic light emitting diode OLED1 is smaller than that in the case of FIG. 12. Therefore, as the capacitance Co1 is slowly charged, the color dragging phenomenon may be viewed.

Accordingly, in the case of FIG. 14, the capacitance Co1 is precharged according to the first offset value OFFSET1 that is larger than 0 in the period of t3 to t4, so that, although a relatively small quantity of charges is supplied to the first organic light emitting diode OLED1 by the driving current at the time t5, the capacitance Co1 is completely charged at a target time, and the first organic light emitting diode OLED1 starts emitting light. Thus, the color dragging phenomenon is prevented.

In addition, the first initialization voltage VINT1 is set larger than the second initialization voltage VINT2, so that the capacitance Co1 of the first organic light emitting diode OLED1 can be precharged with a voltage higher than that of the capacitance Co2 of the second organic light emitting diode OLED2. Thus, at the time t5, the emission time of the first organic light emitting diode OLED1 can be brought further forward than that of the second organic light emitting diode OLED2. Accordingly, referring to FIG. 10, the interval between emission times of the pixels A and C and the pixel B can be reduced.

The first power voltage ELVSS may have a voltage value equal to or higher than the specific voltage value when the target maximum luminance L_tar corresponds to the second maximum luminance group. That is, a potential difference Vd6 is equal to or smaller than Vd4 of FIG. 12, so that reduction in power consumption can be promoted.

The above-described first and second lookup tables LUT1 and LUT2 may be configured with a storage device such as a memory.

According to some example embodiments of the present disclosure, in the display device and the driving method thereof, an initialization voltage is controlled according to a luminance condition, so that the color dragging phenomenon can be removed or reduced.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Aspects of some example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A display device comprising:
   a first pixel comprising a first electrode initialization transistor and a first light emitting diode to emit light having a first color, the first light emitting diode comprising a first electrode and a second electrode; and
   a second pixel comprising a second electrode initialization transistor and a second light emitting diode to emit light having a second color different from the first color, the second light emitting diode comprising a third electrode and a fourth electrode,
   wherein the second electrode of the first light emitting diode and the fourth electrode of the second light emitting diode are configured to receive a first power voltage,
   wherein the first electrode of the first light emitting diode is configured to receive a first initialization voltage through the first electrode initialization transistor, and
   wherein the third electrode of the second light emitting diode is configured to receive a second initialization voltage through the second electrode initialization transistor, the second initialization voltage being different from the first initialization voltage and the first power voltage.

2. The display device of claim 1,
   wherein an area of a light emitting surface of the first light emitting diode is less than an area of a light emitting surface of the second light emitting diode.

3. The display device of claim 1,
   wherein the first pixel further comprises a first driving transistor and a first initialization transistor, the first driving transistor being configured to receive a first voltage through the first initialization transistor,
   wherein the second pixel further comprises a second driving transistor and a second initialization transistor, the second driving transistor being configured to receive a second voltage through the second initialization transistor, and
   wherein the second voltage has a same value as the first voltage.

4. The display device of claim 3,
   wherein the first initialization voltage is different from first voltage.

5. The display device of claim 4,
   wherein the second initialization voltage is different from second voltage.

6. The display device of claim 5,
   wherein the first initialization voltage is greater than the second initialization voltage.

7. The display device of claim 6, further comprising:
   a first data line; and
   a second data line different from the first data line,
   wherein the first pixel is coupled to the first data line, and
   wherein the second pixel is coupled to the second data line.

8. The display device of claim 7, further comprising:
   a first scan line; and
   a second scan line different from the first scan line,
   wherein the first initialization transistor and the second initialization transistor are coupled to the first scan line, and
   wherein the first electrode initialization transistor and the second electrode initialization transistor are coupled to the second scan line.

9. The display device of claim 3,
   wherein a first initialization line connected to the first electrode through the first electrode initialization transistor is to receive the first initialization voltage, and
   wherein a second initialization line connected to the third electrode through the second electrode initialization transistor is to receive the second initialization voltage.

10. The display device of claim 9,
    wherein the first initialization line and the second initialization line are separated from each other.

11. A display device comprising:
    a first pixel comprising a first driving transistor, a first initialization transistor, a first electrode initialization transistor, and a first light emitting diode to emit light having a first color, the first light emitting diode comprising a first electrode; and
    a second pixel including a second driving transistor, a second initialization transistor, a second electrode initialization transistor, and a second light emitting diode to emit light having a second color different from the first color, the second light emitting diode comprising a second electrode,
    wherein the first driving transistor is to receive a first voltage through the first initialization transistor, and the second driving transistor is to receive a second voltage through the second initialization transistor, the second voltage having a same value as the first voltage, and
    wherein the first electrode is to receive a third voltage through the first electrode initialization transistor, and the second electrode is to receive a fourth voltage through the second electrode initialization transistor, the third voltage being different from the fourth voltage.

12. The display device of claim 11,
    wherein the first light emitting diode comprises a third electrode,
    wherein the second light emitting diode comprises a fourth electrode, wherein the third electrode of the first light emitting diode is to receive a first power voltage, and wherein the fourth electrode of the second light emitting diode is to receive the first power voltage.

13. The display device of claim 12, wherein the first power voltage is different from the fourth voltage.

14. The display device of claim 13, wherein the first voltage is different from the third voltage, and wherein the second voltage is different from the fourth voltage.

15. The display device of claim 14, further comprising:
a first data line;
a first switching transistor coupled with the first driving transistor and the first data line;
a scan line of a current stage, a gate electrode of the first switching transistor coupled with the scan line of the current stage;
a second data line different from the first data line; and
a second switching transistor coupled with the second driving transistor and the second data line, a gate electrode of the second switching transistor being coupled with the scan line of the current stage.

16. The display device of claim 15,
wherein one electrode of the first initialization transistor is coupled to a gate electrode of the first driving transistor, and another electrode of the first initialization transistor is to receive the first voltage, and
wherein one electrode of the second initialization transistor is coupled to a gate electrode of the second driving transistor, and another electrode of the second initialization transistor is to receive the second voltage.

17. The display device of claim 16,
wherein one electrode of the first electrode initialization transistor is coupled to the first electrode of the first light emitting diode,
wherein another electrode of the first electrode initialization transistor is to receive the third voltage,
wherein one electrode of the second electrode initialization transistor is coupled to the second electrode of the second light emitting diode, and
wherein another electrode of the second electrode initialization transistor is to receive the fourth voltage.

18. A display device comprising:
a processor configured to determine a first offset value and a second offset value;
an initialization voltage generator configured to generate a first initialization voltage and a second initialization voltage; and
a pixel unit, the pixel unit comprising:
a first pixel comprising a first electrode initialization transistor and a first light emitting diode to emit light having a first color, the first light emitting diode comprising a first electrode and a second electrode; and
a second pixel comprising a second electrode initialization transistor and a second light emitting diode to emit light having a second color different from the first color, the second light emitting diode comprising a third electrode and a fourth electrode, wherein the second electrode of the first light emitting diode and the fourth electrode of the second light emitting diode are to receive a first power voltage;

wherein the first electrode is to receive the first initialization voltage through the first electrode initialization transistor, the first initialization voltage having a value obtained by adding the first offset value to a value of the first power voltage; and wherein the third electrode of the second light emitting diode is to receive the second initialization voltage through the second electrode initialization transistor, the second initialization voltage having a value obtained by adding the second offset value to the value of the first power voltage, the second offset value being different from the first offset value.

19. The display device of claim 18,
wherein an area of a light emitting surface of the first light emitting diode is less than an area of a light emitting surface of the second light emitting diode.

20. The display device of claim 18, further comprising:
a timing controller comprising a first lookup table in which a plurality of first initialization voltage values are stored, the timing controller being configured to determine a value of the first initialization voltage, based on a reception information on the first lookup table.

21. The display device of claim 20, wherein the plurality of first initialization voltage values are obtained by adding first offset values to the value of the first power voltage.

22. The display device of claim 21, wherein the first offset values are greater than or equal to zero.

23. The display device of claim 21, wherein the first offset values are less than zero.

24. The display device of claim 20, wherein the timing controller further comprises a second lookup table in which a plurality of second initialization voltage values are recorded, and the timing controller is configured to determine a value of the second initialization voltage, based on the reception information on the second lookup table.

25. The display device of claim 24, wherein the plurality of second initialization voltage values are obtained by adding second offset values to the value of the first power voltage.

26. The display device of claim 25, wherein the second offset values are greater than or equal to zero.

27. The display device of claim 25, wherein the second offset values are less than zero.

28. The display device of claim 25,
wherein the second offset values are less than first offset values.

29. The display device of claim 20, the reception information is manually set as a user manipulates the display device, or is automatically set using an algorithm linked with a sensor.

30. The display device of claim 18,
wherein a second power voltage to be supplied to the first electrode of the first light emitting diode and the third electrode of the second light emitting diode has a fixed value.

* * * * *